United States Patent
Maeda et al.

(10) Patent No.: US 9,949,388 B2
(45) Date of Patent: Apr. 17, 2018

(54) WATERPROOF VENTILATOR AND ELECTRONIC DEVICE APPARATUS

(71) Applicant: MITSUBISHI ELECTRIC CORPORATION, Chiyoda-ku (JP)

(72) Inventors: Yuki Maeda, Chiyoda-ku (JP); Taro Ueda, Chiyoda-ku (JP); Hidetaka Yamauchi, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 15/516,771

(22) PCT Filed: Nov. 11, 2015

(86) PCT No.: PCT/JP2015/081721
§ 371 (c)(1),
(2) Date: Apr. 4, 2017

(87) PCT Pub. No.: WO2016/076351
PCT Pub. Date: May 19, 2016

(65) Prior Publication Data
US 2017/0303409 A1    Oct. 19, 2017

(30) Foreign Application Priority Data

Nov. 14, 2014   (JP) .................................. 2014-231217

(51) Int. Cl.
*H01L 23/28*      (2006.01)
*H01B 17/58*     (2006.01)
(Continued)

(52) U.S. Cl.
CPC ......... *H05K 5/0213* (2013.01); *B01D 53/268* (2013.01)
(Continued)

(58) Field of Classification Search
CPC ........ H05K 5/06; H05K 5/0213; H05K 5/068; H05K 2203/1178; F16K 24/00;
(Continued)

(56) References Cited

U.S. PATENT DOCUMENTS 4,086,394 A * 4/1978 Tesch .................. H01M 2/1205
220/374
5,367,438 A * 11/1994 Deslandres ........... F21S 48/335
362/294

(Continued)

FOREIGN PATENT DOCUMENTS

JP     64-21906 U    2/1989
JP     64-54374 U    4/1989
(Continued)

OTHER PUBLICATIONS

Machine English Translation of Ichikoh (JP64-21906U) provided with Office Action.*
International Search Report dated Feb. 16, 2016 in PCT/JP2015/081721 filed Nov. 11, 2015.

*Primary Examiner* — Chau N Nguyen
*Assistant Examiner* — Roshn Varghese
(74) *Attorney, Agent, or Firm* — Oblon, McClelland, Maier & Neustadt, L.L.P.

(57) ABSTRACT

A waterproof ventilator includes: an outer hollow body including: an internal space; a side with an outer opening adopted not to be covered with a water film at a lower portion thereof; and a bottom; and an inner hollow body including an internal space, at least a part of which is housed in the outer hollow body, and including: an outer surface disposed so as not to cause a water film to stay in a gap with an inner surface of the outer hollow body; an inner opening provided at a position not to be hit directly with water entering into the internal space of the outer hollow body through the outer opening and adopted not to be covered (Continued)

with a water film; an upper opening provided at an upper side than the inner opening and communicating with an exterior of the outer hollow body; and a bottom.

20 Claims, 13 Drawing Sheets

(51) Int. Cl.
*H02G 3/22* (2006.01)
*H01B 17/26* (2006.01)
*H05K 5/02* (2006.01)
*B01D 53/26* (2006.01)

(58) Field of Classification Search
CPC ........ F21S 48/33; F21S 48/332; F21S 48/337; B01D 2053/223; B01D 53/268
USPC ........... 174/14 R, 522, 564; 220/89.1, 366.1, 220/367.1, 374, 745, 747, 748, 913; 96/4; 454/339; 55/385.4; 362/547
See application file for complete search history.

(56) References Cited

U.S. PATENT DOCUMENTS

| | | | | |
|---|---|---|---|---|
| 6,364,924 | B1* | 4/2002 | Mashiko | F21S 48/335 55/385.1 |
| 6,883,948 | B2* | 4/2005 | Vanduyn | F21S 48/335 362/267 |
| 8,430,114 | B2* | 4/2013 | Welch | F16H 57/027 137/197 |
| 8,454,719 | B2* | 6/2013 | Tesner | F16H 57/027 55/385.3 |
| 2005/0091949 | A1* | 5/2005 | Origlia | B60R 16/0239 55/385.4 |
| 2005/0241937 | A1* | 11/2005 | Shichida | G01N 27/4077 204/424 |

FOREIGN PATENT DOCUMENTS

| | | |
|---|---|---|
| JP | 6-2112 Y2 | 1/1994 |
| JP | 2010-513813 | 4/2010 |
| JP | 2010-175057 A | 8/2010 |
| JP | 2014-120579 A | 6/2014 |

* cited by examiner

WATERPROOF VENTILATOR AND ELECTRONIC DEVICE APPARATUS

TECHNICAL FIELD

The present disclosure relates to a waterproof ventilator provided for a vent to communicate an interior with an exterior of a housing of an electronic device apparatus installed outdoors, and the electronic device apparatus provided with this waterproof ventilator.

BACKGROUND ART

Conventionally, as a waterproof ventilation structure that is provided for a vent to communicate an interior and an exterior of a housing of an electronic device apparatus installed outdoors, a waterproof ventilation structure in which a water-repellent microporous member (referred to as a waterproof ventilation sheet) having properties of allowing air to pass but water to not pass, and a labyrinth structure is provided to cover the water-repellent microporous member is known (Patent Literature 1).

CITATION LIST

Patent Literature

[Patent Literature 1]: Japanese Unexamined Patent Application Publication No. 2014-120579

SUMMARY

Technical Problem

There is a case where the electronic device apparatus installed outdoors is exposed to heavy wind and rain. There is also a case where, when the electronic device apparatus is mounted on a ship or the like, a wave or the like is splashed on the apparatus. In the waterproof ventilation structure of Patent Literature 1, there are problems as follows. There is a case where water stays in an opening or interior of the labyrinth structure and blocks a channel of ventilating air. In such state, if a pressure of the interior of the housing becomes negative pressure (in a state where the pressure thereof is lower than an outside atmospheric pressure), the interior of the housing may suck water beyond the waterproof ventilation sheet. If a strong jet hits directly from a downward direction or an obliquely downward direction, a stream of water hits directly to the waterproof ventilation sheet. The waterproof ventilation sheet is deteriorated by various environmental loads, a waterproof property or ventilation property is decreased.

The present disclosure is made to solve the above problems and is intended to have predetermined waterproof performance and to be able to prevent water from entering into a housing even when air enters into the housing on which a waterproof ventilator is mounted after the waterproof ventilator is exposed to the water.

Solution to Problem

A waterproof ventilator according to the present disclosure includes an outer hollow body and an inner hollow body. The outer hollow body has an internal space and a side with outer openings adopted not to be covered with a water film at a lower portion thereof. The inner hollow body has an internal space, and at least a part of the inner hollow body is housed in the outer hollow body. An outer surface of the inner hollow body is disposed so as not to cause a water film to stay in a gap with the inner surface of the outer hollow body. The inner hollow body has an inner opening and an upper opening. The inner opening is provided at a position not to be hit directly with water entering the internal space of the outer hollow body through the outer opening and adopted not to be covered with a water film. The upper opening is provided at an upper side than the inner opening and communicates with an exterior of the outer hollow body.

Advantageous Effects of Invention

According to the waterproof ventilator according to the present disclosure, the waterproof ventilator have predetermined waterproof performance and can prevent water from entering into the housing even when air enters into the housing on which the waterproof ventilator is mounted after the waterproof ventilator is exposed to the water.

DESCRIPTION OF EMBODIMENTS

First Embodiment

Figure 1:
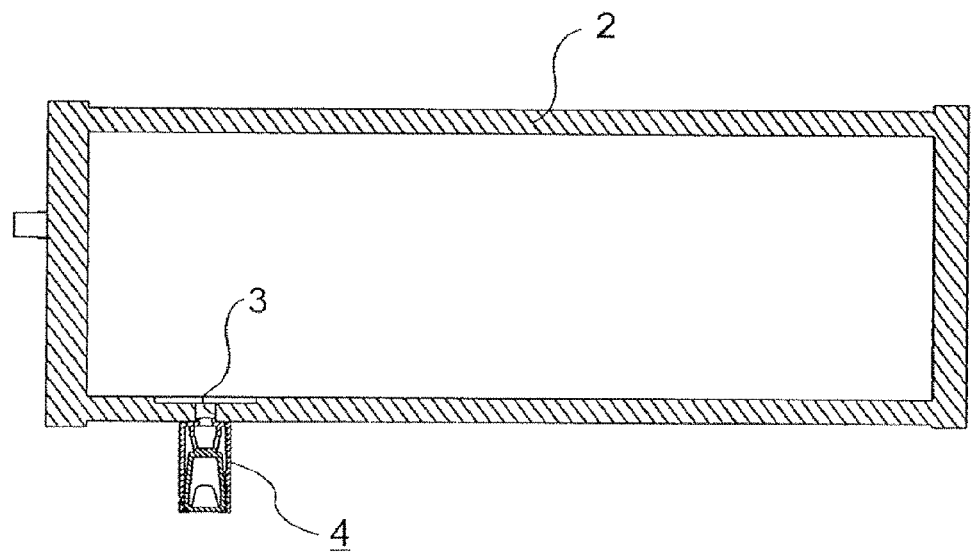
FIG. 1 is a cross-sectional view of an electronic device apparatus having a waterproof ventilator according to a first embodiment of the present disclosure.
Figure 2:
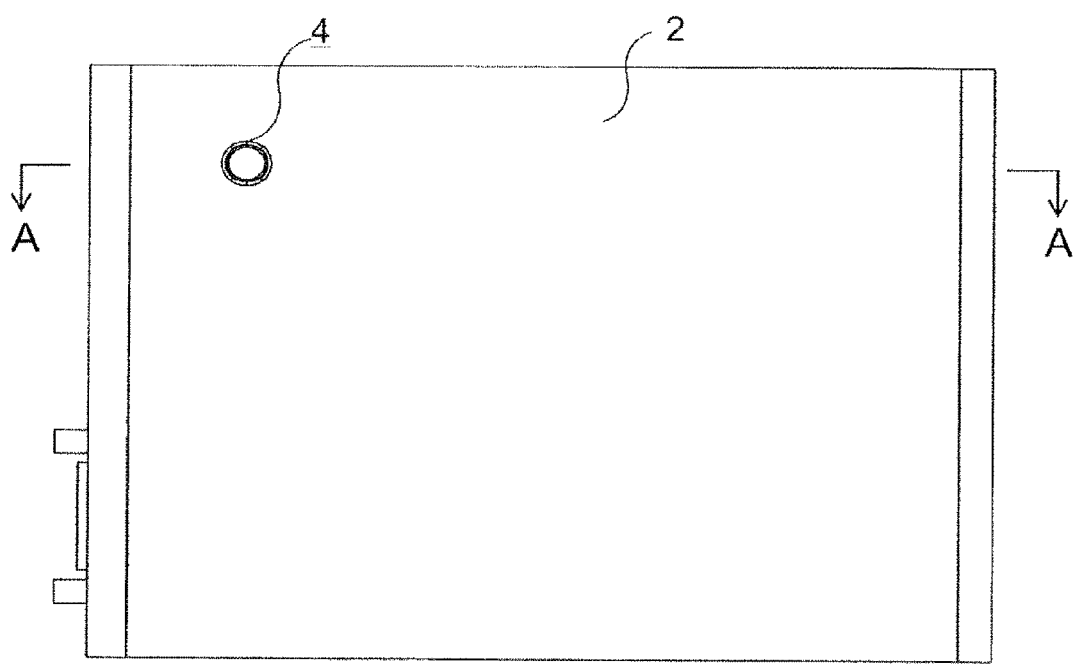
FIG. 2 is a plan view of the electronic device apparatus having the waterproof ventilator according to the first embodiment as viewed from a lower side.

A structure of an electronic device apparatus having a waterproof ventilator according to a first embodiment of the present disclosure is described using FIGS. 1 and 2. FIG. 1 is a cross-sectional view of an electronic device apparatus having a waterproof ventilator according to the first embodiment of the present disclosure. FIG. 2 is a plan view of the electronic device apparatus having the waterproof ventilator according to the first embodiment as viewed from a lower side. FIG. 1 is a cross-sectional view along line A-A, illustrated in FIG. 2, which is a position passing through the waterproof ventilator.

An electronic device 1 (not illustrated) that is a device that uses electricity is housed in a housing 2. The bottom of the housing 2 is provided with a vent 3. The waterproof ventilator 4 is mounted under the vent 3. The waterproof ventilator 4 causes air to pass and communicate through the vent 3 with an exterior of the housing 2. Simultaneously, the waterproof ventilator 4 waterproofs, that is, prevents water from entering an interior of the housing 2 through the vent 3. As a method of mounting the waterproof ventilator 4 on the housing 2, an adequate method such as an adhesive, screwing, and so on is used.

Figure 3:
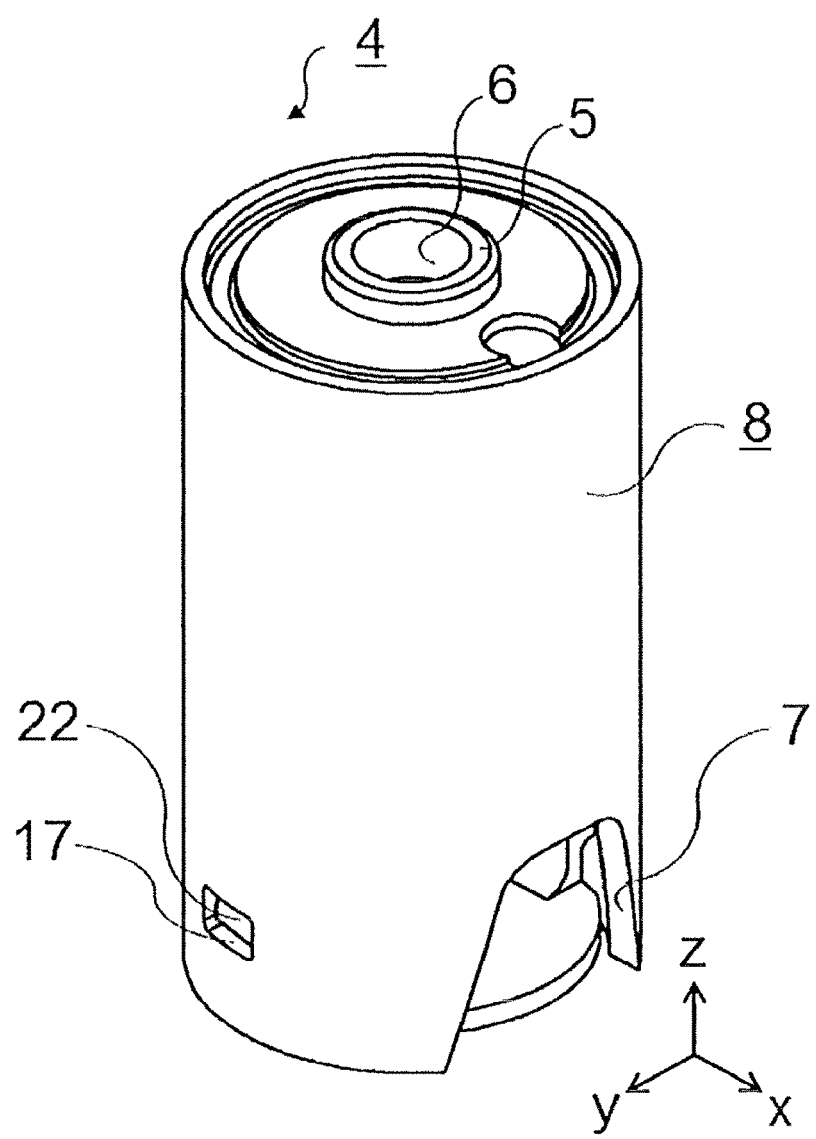
FIG. 3 is a perspective view of the waterproof ventilator according to the first embodiment.
Figure 4:
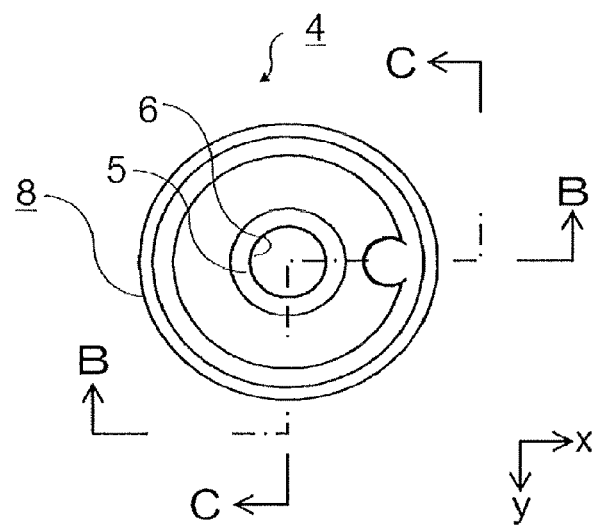
FIG. 4 is a plan view of the waterproof ventilator according to the first embodiment.
Figure 5:
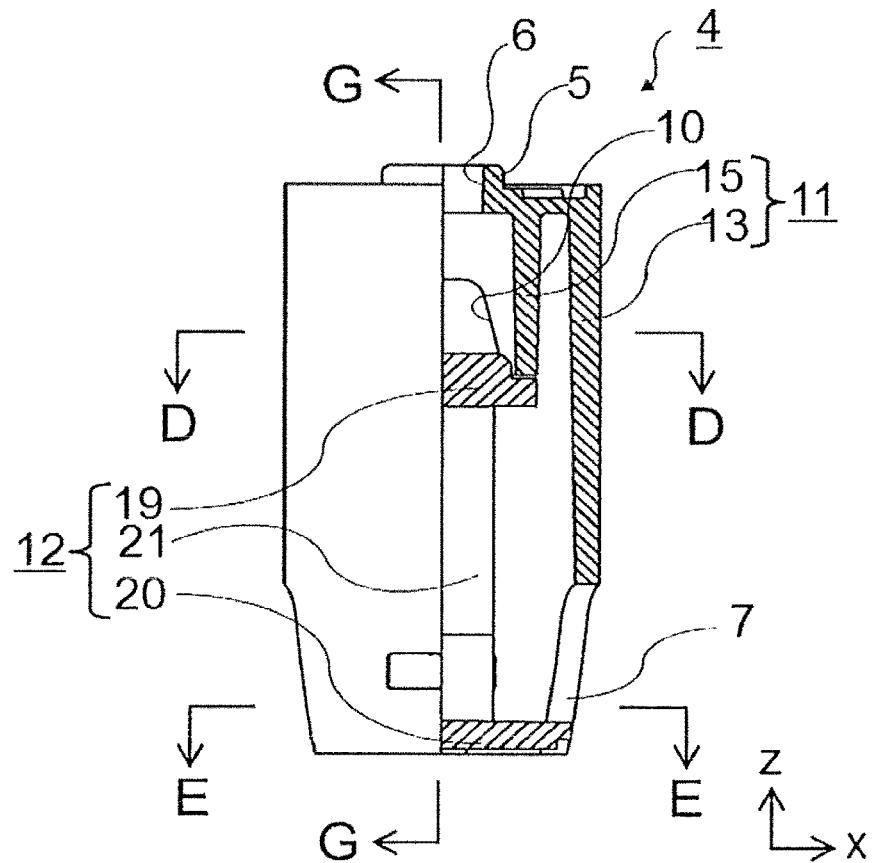
FIG. 5 is a vertical cross-sectional view of the waterproof ventilator according to the first embodiment along line B-B illustrated in FIG. 4.
Figure 6:
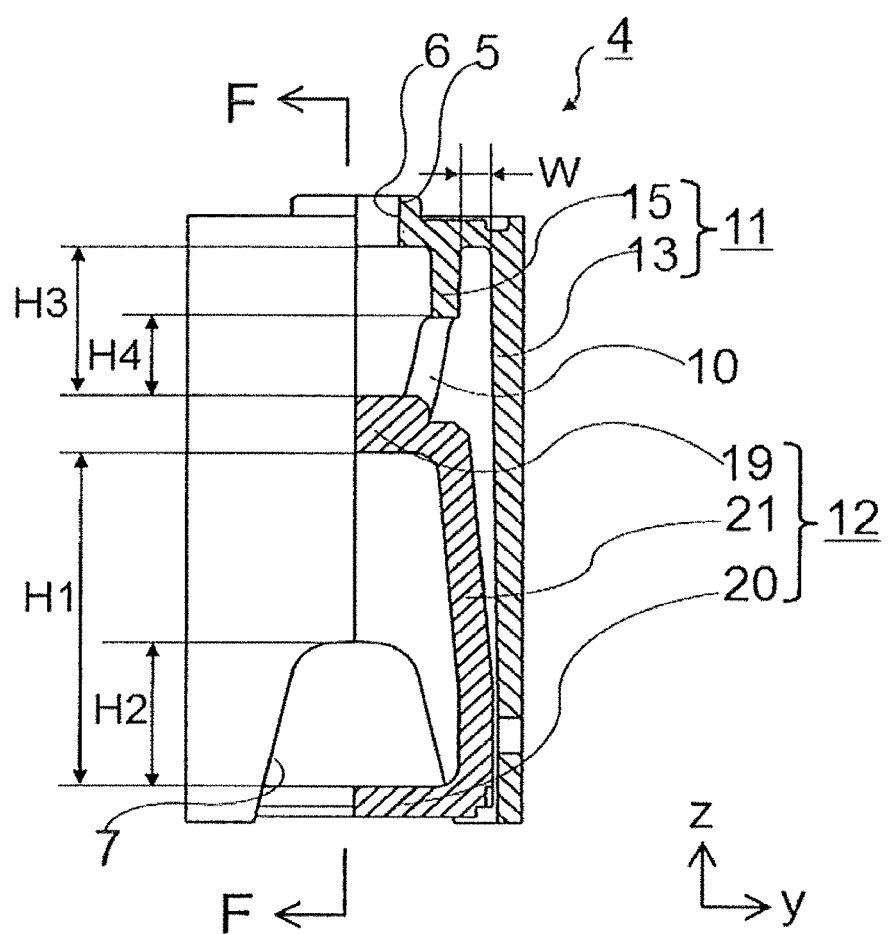
FIG. 6 is a vertical cross-sectional view of the waterproof ventilator according to the first embodiment along line C-C illustrated in FIG. 4.
Figure 7:
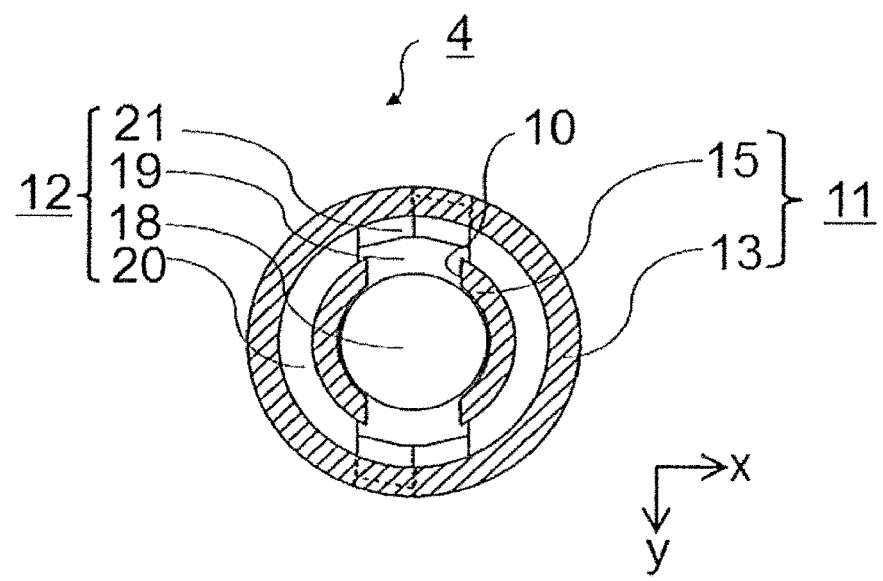
FIG. 7 is a horizontal cross-sectional view of the waterproof ventilator according to the first embodiment along line D-D illustrated in FIG. 5.
Figure 8:
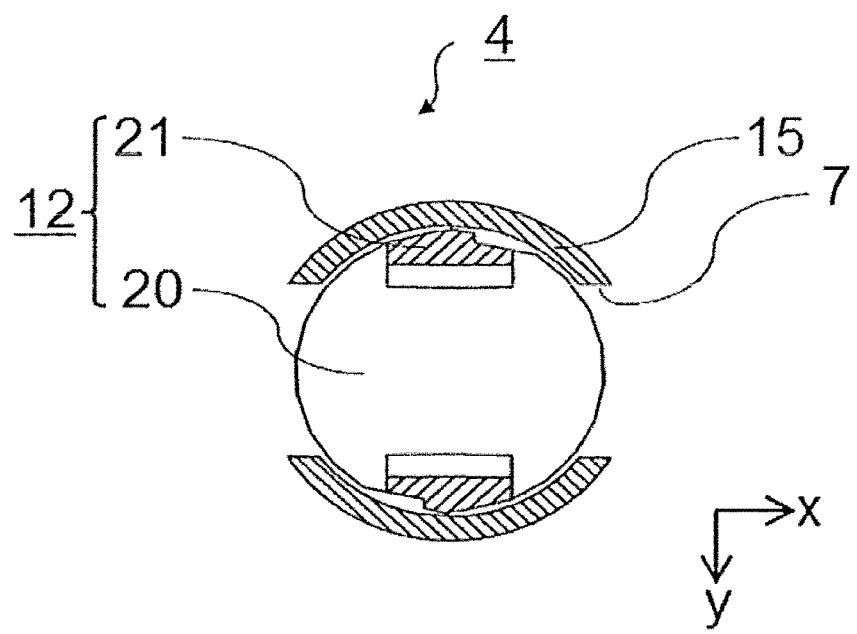
FIG. 8 is a horizontal cross-sectional view of the waterproof ventilator according to the first embodiment along line E-E illustrated in FIG. 5.
Figure 9:
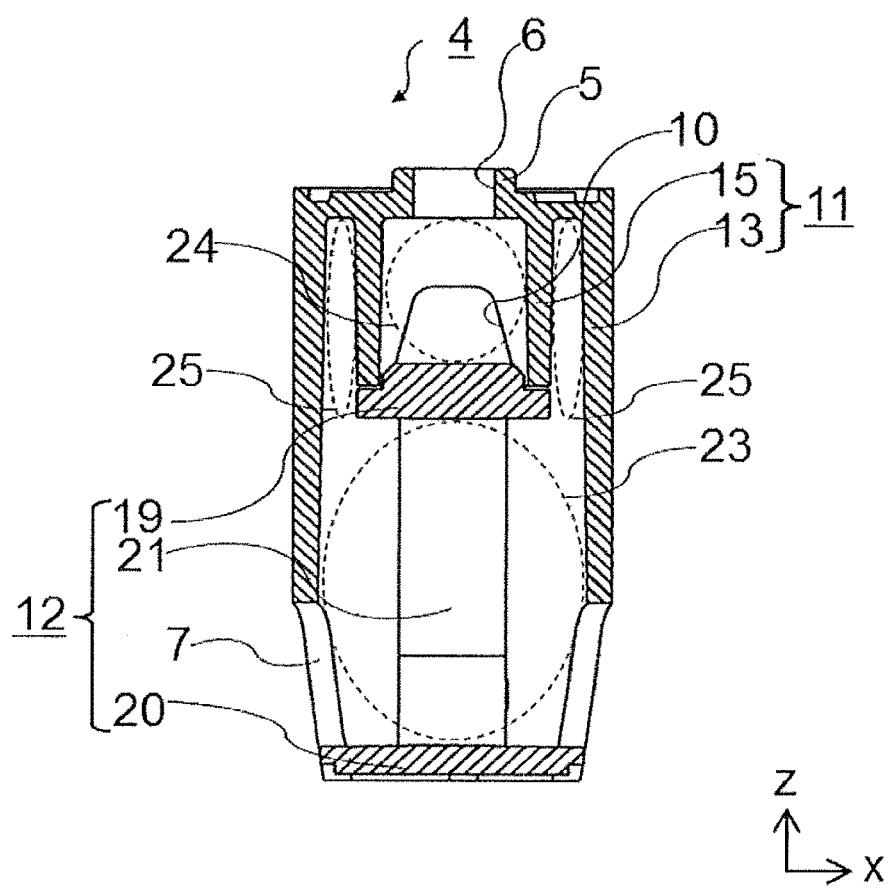
FIG. 9 is a vertical cross-sectional view along line F-F illustrated in FIG. 6 to illustrate a structure of the waterproof ventilator according to the first embodiment.
Figure 10:
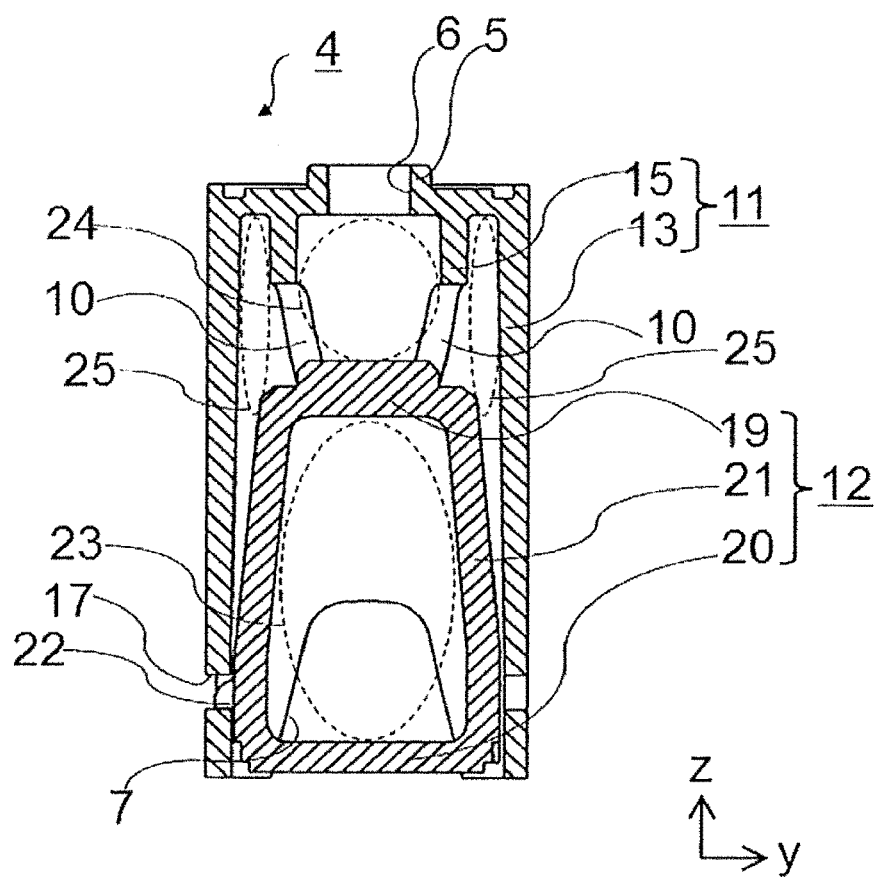
FIG. 10 is a vertical cross-sectional view along line G-G illustrated in FIG. 5 to illustrate the structure of the waterproof ventilator according to the first embodiment.
Figure 11:
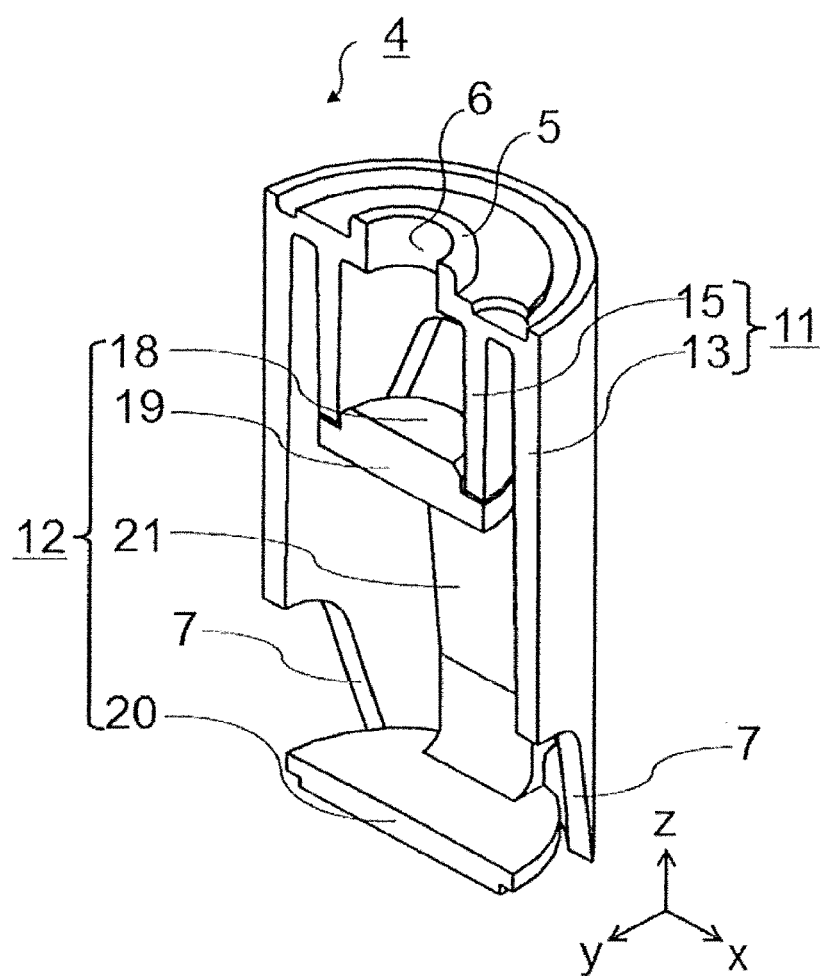
FIG. 11 is a perspective view of the waterproof ventilator cut along line F-F illustrated in FIG. 6 to illustrate the structure of the waterproof ventilator according to the first embodiment.
Figure 12:
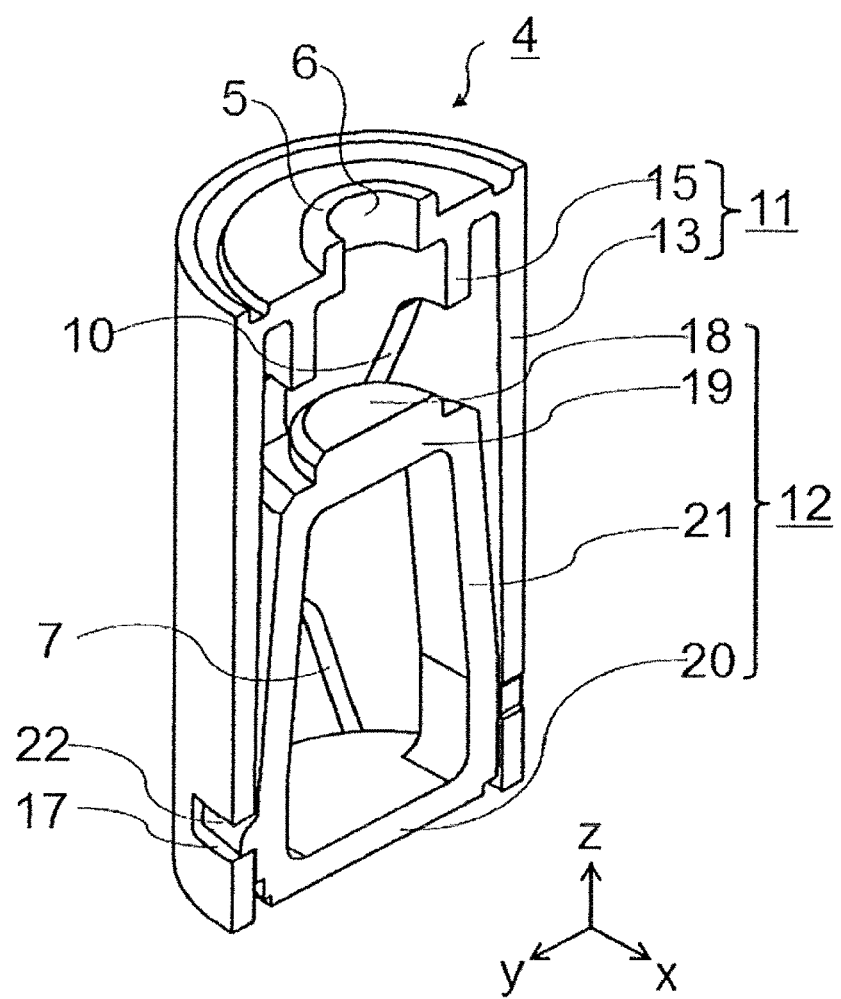
FIG. 12 is a perspective view of the waterproof ventilator cut along line G-G illustrated in FIG. 5 to illustrate the structure of the waterproof ventilator according to the first embodiment.
Figure 13:
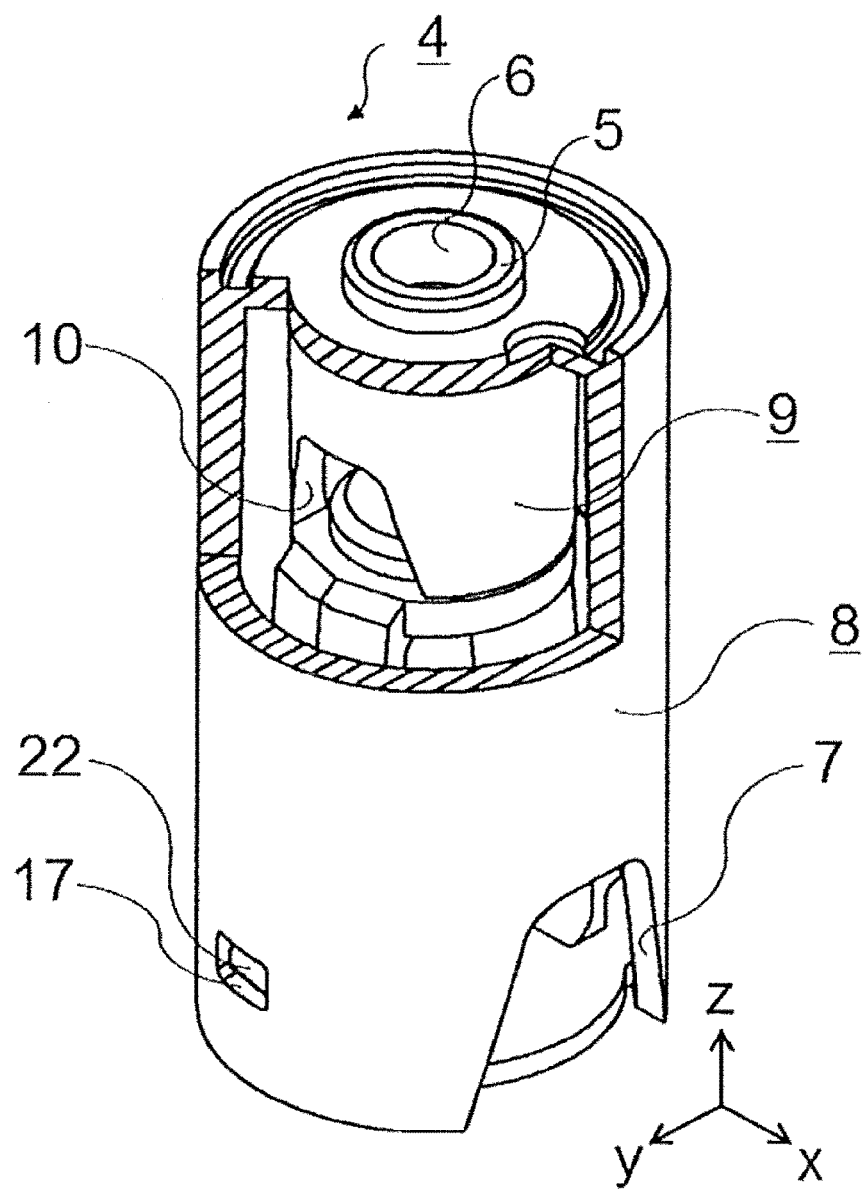
FIG. 13 is a perspective view of the waterproof ventilator whose upper side is cut away partly to illustrate the structure of the waterproof ventilator according to the first embodiment.
Figure 14:
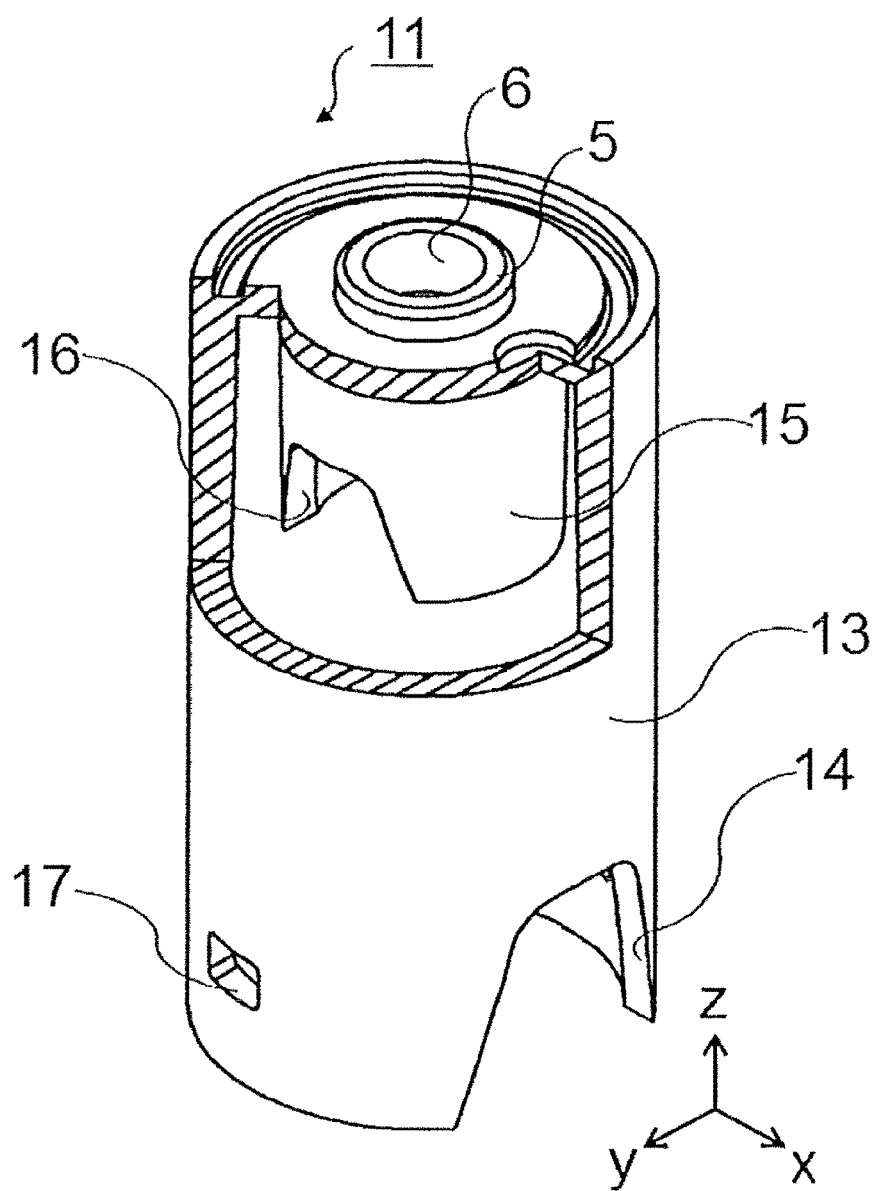
FIG. 14 is a perspective view of a double tubular member whose upper side is cut away partly to illustrate a structure of the double tubular member of the waterproof ventilator according to the first embodiment.
Figure 15:
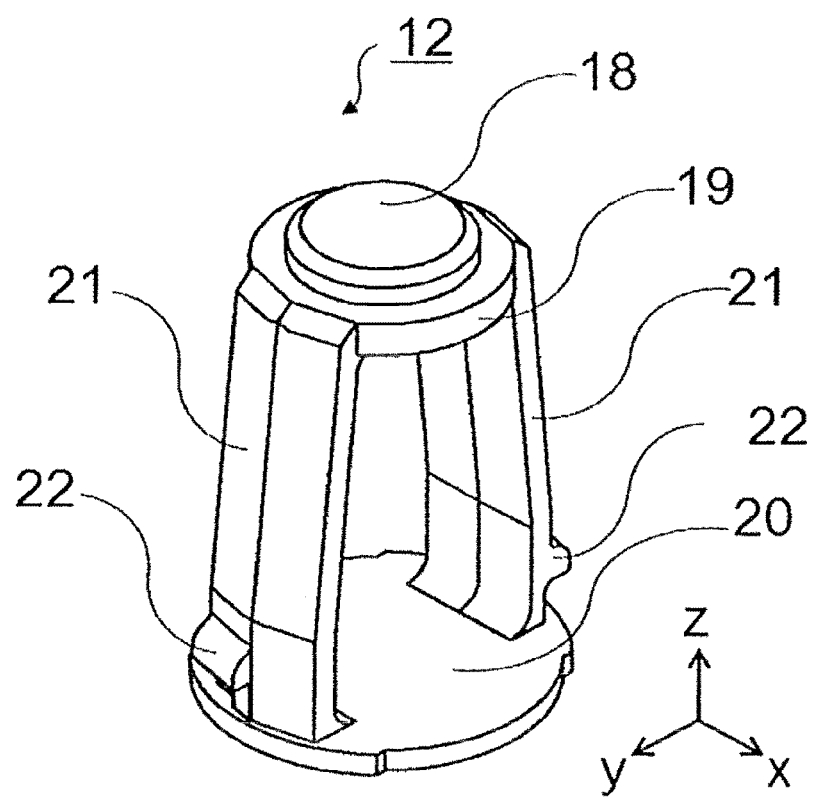
FIG. 15 is a perspective view of a bottom member of the waterproof ventilator according to the first embodiment.

A structure of the waterproof ventilator according to the first embodiment is described using FIGS. 3 to 15. FIG. 3 is a perspective view of the waterproof ventilator according to the first embodiment. FIG. 4 is a plan view of the waterproof ventilator according to the first embodiment. FIG. 5 is a vertical cross-sectional view of the waterproof ventilator according to the first embodiment along line B-B illustrated in FIG. 4. FIG. 6 is a vertical cross-sectional view of the waterproof ventilator according to the first embodiment along line C-C illustrated in FIG. 4. FIG. 7 is a horizontal cross-sectional view of the waterproof ventilator according to the first embodiment along line D-D illustrated in FIG. 5. FIG. 8 is a horizontal cross-sectional view of the waterproof ventilator according to the first embodiment along line E-E illustrated in FIG. 5. FIG. 9 is a vertical cross-sectional view along line F-F illustrated in FIG. 6 to illustrate the structure of the waterproof ventilator according to the first embodiment. FIG. 10 is a vertical cross-sectional view along line G-G illustrated in FIG. 5 to illustrate the structure of the waterproof ventilator according to the first embodiment. FIG. 11 is a perspective view of the waterproof ventilator cut along line F-F illustrated in FIG. 6 to illustrate the structure of the waterproof ventilator according to the first embodiment. FIG. 12 is a perspective view of the waterproof ventilator cut along line G-G illustrated in FIG. 5 to illustrate the structure of the waterproof ventilator according to the first embodiment. FIG. 13 is a perspective view of the waterproof ventilator whose upper side is cut away partly to illustrate the structure of the waterproof ventilator according to the first embodiment. FIG. 14 is a perspective view of a double tubular member whose upper side is cut away partly to illustrate a structure of the double tubular member of the waterproof ventilator according to the first embodiment. FIG. 15 is a perspective view of a bottom member of the waterproof ventilator according to the first embodiment.

As illustrated in FIG. 3, the waterproof ventilator 4 has a cylindrical external shape with upper and lower bottoms and has a diameter of about 2 cm and a height of about 3 cm. A top of the waterproof ventilator 4 has a boss 5 whose outer diameter is nearly identical to an inner diameter of the vent 3 and a housing-side hole 6 provided in the boss 5. A lower portion of a side of the waterproof ventilator 4 has two outer openings 7 provided to be opposite to each other. A shape of each outer opening 7 is a trapezoidal shape in which upper corners are rounded. The side in which the outer openings 7 are provided, a bottom, and the top constitute an outer hollow body 8 having an internal space. An upper portion of the boss 5 enters the vent 3, when the waterproof ventilator 4 is mounted on the housing 2. The housing-side hole 6 is an upper opening to communicate with the vent 3.

Here, as illustrated in FIG. 3, directions of x, y, and z axes orthogonal to one another are defined. The z axis is a direction perpendicular to the top of the waterproof ventilator 4, namely a height direction. The x and y axes are within a plane parallel to the top of the waterproof ventilator 4. The x axis is a direction in which the two outer openings 7 are opposite to each other, namely a direction parallel to a straight line connecting the centers of the two outer openings 7. They axis is a direction perpendicular to the x axis and the z axis. The waterproof ventilator 4 is formed in line symmetry with respect to the z axis, in xz and yz planes.

FIG. 4, shows that positions of vertical cross-sections each of which is a plane including the z axis and for illustrating the structure of the waterproof ventilator 4. B-B cross-section is a partial cross-section in which the right half in the view of the waterproof ventilator 4 is shown as a cross-section parallel to the xz plane and the left half is shown as a side view. C-C cross-section is a partial cross-section in which the right half in the view of the waterproof ventilator 4 is shown as a cross-section parallel to the yz plane and the left half is shown as a side view.

FIG. 5, shows that positions of horizontal cross-sections each of which is a plane parallel to the xy plane and for illustrating the structure of the waterproof ventilator 4. D-D cross-section is a horizontal cross-section at a portion where an inner hollow body 9 exists. E-E cross-section is a horizontal cross-section at a lower side of the inner hollow body 9.

As illustrated in FIG. 13, the waterproof ventilator 4 has a structure in which the inner hollow body 9, which is another hollow body, is provided in an upper portion of the internal space of the cylindrical outer hollow body 8. The inner hollow body 9 has a cylindrical shape with upper and lower bottoms. A lower portion of the inner hollow body 9 is also provided with two inner openings 10 that are opposite to each other. A direction in which the two inner openings 10 are opposite to each other, namely a straight line that connects the centers of the two inner openings 10, is parallel to the y axis. A shape of each inner opening 10 is a trapezoidal shape in which corners are rounded.

The waterproof ventilator 4 is made up of a double tubular member 11 having double cylinders, whose lower bottoms are open and upper bottoms are shared and which are disposed such that central axes thereof are located at the same position, and a bottom member 12 to close the open lower bottoms of the two cylinders of the double tubular member 11. As illustrated in FIG. 14, a lower bottom side, namely a lower end, of an outer tube 13 of the double tubular member 11 is provided with two trapezoidal cutouts 14 at positions opposite to each other. A length of an inner tube 15 is about 30% of that of the outer tube 13. A lower bottom side, namely a lower end, of the inner tube 15 is also provided with two trapezoidal cutouts 16 at positions opposite to each other. A straight line connecting the centers of two cutouts 14 of the outer tube 13 and a straight line connecting the centers of two cutouts 16 of the inner tube 15 are orthogonal to each other. To be exact, these two straight lines are not on the same plane and form skew lines. The term "orthogonal" used herein includes a state where the two straight lines being on the same plane by parallel translation of either straight line are orthogonal to each other. The cutouts 14 of the outer tube 13 are provided such that the outer openings 7 are formed between the cutouts 14 and the lower bottom for the outer tube 13, which is a part of the bottom member 12. The cutouts 16 of the inner tube 15 are also provided such that the inner openings 10 are formed between the cutouts 16 and the lower bottom for the inner tube 15, which is another part of the bottom member 12.

Since the outer openings 7 are provided to be just above a lower bottom of the outer hollow body 8, water entering the outer hollow body 8 runs out through the outer openings 7 by gravity. Since the inner openings 10 are provided to be just above a lower bottom of the inner hollow body 9, water entering the inner hollow body 9 runs out through the inner openings 10 by gravity.

Two claw fitting holes 17 for integrating the double tubular member 11 and the bottom member 12 are provided at opposite positions in a lower portion of the outer tube 13. Cross-sectional shapes of the two claw fitting holes 17 are the same and have rectangular shapes in which corners are rounded. The two claw fitting holes 17 are located at the same height from the lower end of the outer tube 13.

As illustrated in FIG. 15, the bottom member 12 has an inner bottom 19 having a circular protrusion 18 fitted into the inner tube 15, an outer bottom 20 to close the open lower bottom of the outer tube 13, and two legs 21 that are links for connecting the inner bottom 19 and the outer bottom 20.

The two legs 21 are provided with respective claws 22 having half widths of the legs 21, at outer lower portions at the same height. The claws 22 of the legs 21 are fitted into the claw fitting holes 17 of the outer tube 13, and thereby the double tubular member 11 and the bottom member 12 are integrated. Thus, the outer hollow body 8 is composed of the outer tube 13 and the outer bottom 20. The inner hollow body 9 is composed of the inner tube 15 and the inner bottom 19. Positions of the claws 22 and the claw fitting holes 17 are positions at which a lower end of the outer bottom 20 and the lower end of the outer tube 13 are coincident with each other in a state where the claws 22 are fitted in the claw fitting holes 17 respectively. As illustrated in FIG. 12, a cross-sectional shape of each claw 22 in a plane, which passes the center of the bottom member 12 and includes the z axis, is a fan shape in which a lower side is linear, an upper side is arcuate, and a central angle is 90 degrees.

As illustrated with an ellipse indicated by a broken line in FIGS. 9 and 10, an internal space of the outer hollow body 8 is divided into three parts roughly. The first part is a lower space 23 that is a space below the inner hollow body 9. The second part is an upper space 24 that is the internal space of the inner hollow body 9. The third part is a communication space 25 that is located above the lower bottom of the inner hollow body 9 and outside the inner hollow body 9. As illustrated in FIG. 9, the lower space 23 and the communication space 25 communicate with each other through inside portions of the outer tube 13 where the outer openings 7 are provided respectively. As illustrated in FIG. 10, since the legs 21 of the bottom member 12 are provided at lower sides of portions of the inner tube 15 where the inner openings 16 are provided respectively, the lower space 23 and the communication space 25 do not communicate with each other at these portions. As illustrated in FIG. 10, the communication space 25 and the upper space 24 communicate with each other through the inner openings 10. As a matter of course, the communication space 25 and the upper space 24 do not communicate with each other at a portion other than the inner openings 10 of the inner tube 15.

Variables related to dimensions of the openings and the spaces are defined as follows. These variables are depicted in FIG. 6.

H1: Height of the lower space 23
H2: Height of the outer opening 7
H3: Height of the upper space 24
H4: Height of the inner opening 10
W: Interval between an inner surface of the outer tube 13 and an outer surface of the inner tube 15

The outer openings 7 and the inner openings 10 are decided in shape and size such that a water film due to surface tension cannot exist at any one of these openings. The interval W between the inner surface of the outer tube 13 and the outer surface of the inner tube 15 is also sufficiently large such that the water film cannot exist between the inner surface of the outer tube 13 and the outer surface of the inner tube 15 depending on shapes of tubes.

In the first embodiment, relationships of H1/H2>2 and H3/H4>1.5 are set. With respect to the same H2, as H1/H2 increases, a probability that the water entering the lower space 23 through the outer openings 7 arrives at the inner openings 10 is reduced. Likewise, with respect to the same H4, if H3/H4 is increased, a probability that the water entering the upper space 24 through the inner openings 10 arrives at the housing-side hole 6 is reduced. The probability that the water entering the lower space 23 arrives at the inner openings 10 is reduced as H1 increases if H1/H2 is the same. The probability that the water entering the upper space 24 arrives at the housing-side hole 6 is reduced as H3 increases if H3/H4 is the same. Dimensions of each part of the waterproof ventilator are decided depending on an amount of ventilating air to be performed, a restriction about an installable space, and so on appropriately.

Next, a waterproofing operation of the waterproof ventilator 4 in the first embodiment is described. The waterproof ventilator 4 satisfies the degree of protection 6 (IPX6) of the JIS standard "Degrees of protection provided by enclosures for electrical equipment (JIS C 0920)." In the degree of protection 6 (IPX6), "there is no harmful effects caused by strong jets of water from all directions (a waterproof type)" is required.

The waterproof ventilator 4 has the following three structures for waterproofing.

(A) A structure of an abrupt expansion pipe making a cross-sectional area of an internal space be larger than cross-sectional areas of the outer openings 7.
(B) A labyrinth structure in which paths from the outer openings 7 to the housing-side hole 6 are bent many times.
(C) A structure not to cause a water film due to surface tension to stay across the openings or the interior.

First, a waterproofing operation against a water jet, by the structure of the abrupt expansion pipe of the waterproof ventilator 4, is described. The two outer openings 7 and the lower space 23 can be regarded as pipelines in the direction of the x axis. As can be seen from FIG. 10, since a width of each of the outer openings 7 and a width of the lower space are nearly the same, a ratio between a cross-sectional area of the pipeline in each of the outer openings 7 and a cross-sectional area of the pipeline in the lower space 23 is nearly identical to a height ratio (=H1/H2). That is, a so-called abrupt expansion pipe in which the cross-sectional area is expanded abruptly two times or more for water entering through the outer openings 7 is formed. A flow of water flowing from an exterior into an interior of the waterproof ventilator 4 is considered to flow mainly in the direction of the x axis. A flow of water in the direction of the x axis is disturbed and causes a loss at abrupt expansion portions just after entering through the outer openings 7. For this reason, there is an effect of reducing an amount of water going upward through the outer openings 7.

Since the two outer openings 7 are opposite to each other, most of water entering from the outside flows down through the outer opening 7 opposite to the outer opening 7 through which the water has entered. In this way, since there is two of the outer openings 7 having a certain size as compared to a size of the entire waterproof ventilator 4, even when any one of the outer openings 7 loses ventilation performance by water entering continuously or foreign materials, ventilation can be performed in the other outer opening 7. Water, which moves upward in the inner hollow body 9 and then drops by gravity, is also discharged easily to the exterior of the waterproof ventilator 4.

When a direction of the water jet is inclined with respect to the direction of the x axis, effective cross-sectional areas of the outer openings 7 is reduced, and thus water entering into the waterproof ventilator 4 is reduced. The cross-sectional area is increased gradually for the water jet inclined with respect to the direction of the x axis, but a ratio of the increase of the cross-sectional area is also increased. For this reason, an effect of reducing momentum of the water stream is considered not to be reduced greatly compared with the case of the direction of the x axis.

Figure 16:
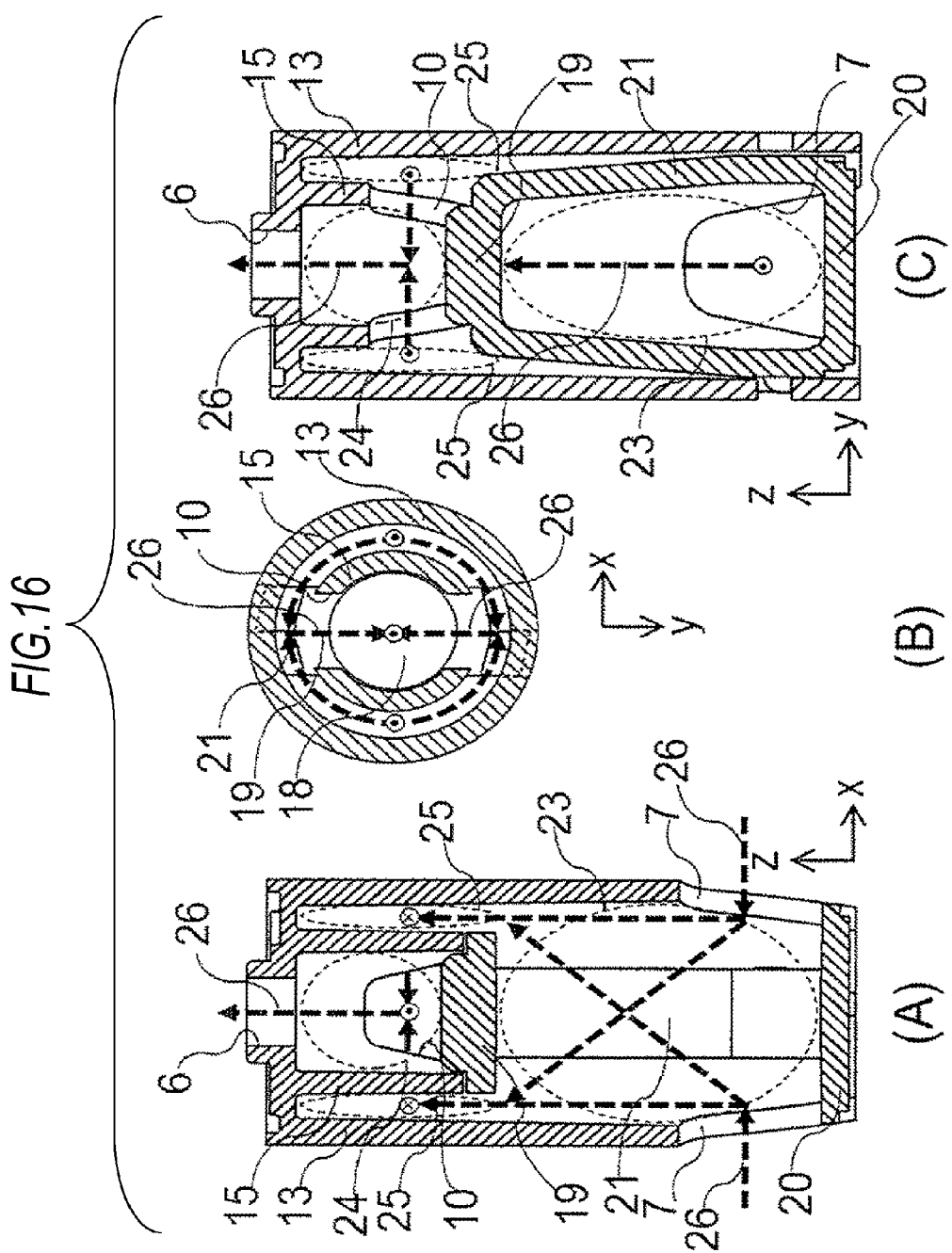
FIG. 16 is a cross-sectional view illustrating paths from outer openings of the waterproof ventilator according to the first embodiment to a housing-side hole of the top thereof.

Next, characteristics and effects of the labyrinth structure of the waterproof ventilator 4 is described. FIG. 16 is a cross-sectional view illustrating paths from the outer openings of the waterproof ventilator to the housing-side hole of the top thereof, according to the first embodiment. Since each of the legs 21 exists at a position lower than a space being outward in a radial direction from each of the inner openings 10, it is not possible to move directly from the lower space 23 to the communication space 25 being outward in the radial direction from the inner openings 10, and thus the path becomes as follows. As illustrated in FIG. 16A, a path 26 from each of the outer openings 7 to the housing-side hole 6 of the top is changed in an upward direction at a position just after entering to the outer openings 7 or a position just before exiting through the other outer opening 7, and enters from the lower space 23 into the communication space 25. As illustrated in FIG. 16B, the paths 26 go around about one fourth of a space between the outer tube 13 and the inner tube 15 toward the inner openings 10 and enter through the inner openings 10 into the upper space 24. As illustrated in FIG. 16C, the paths 26 are changed in an upward direction in the upper space 24 and reach the housing-side hole 6. In this way, at least four times of changing a direction at an angle close to a right angle are required to reach to the housing-side hole 6 of the top from the outer openings 7. These paths are paths going upward against the gravity.

It is not possible to view the inner openings 10 unobstructed through the outer openings 7. The inner openings 10 are provided at positions at which water entering into the outer hollow body 8 through the outer openings 7 does not hit directly. Since the legs 21 exist at positions lower than space being just outward in the radial direction of the inner openings 10 respectively, the fluid entering the inner openings 10 moves in the communication space 25 mainly in a horizontal direction. This means that the legs 21 function as flow path restrictors for preventing the fluid from entering the inner openings 10 from lower sides. A member for restricting a flow path toward the inner openings 10 from the lower sides may be mounted at upper portions of the legs of the bottom member. The inner bottom and the outer bottom may be separate members, and a member for restricting a flow path toward the inner openings from the lower side may be provided for the inner bottom.

A fluid (water or water-containing air) entering through the outer openings 7 into the waterproof ventilator 4 hits against internal walls of the waterproof ventilator 4 in the waterproof ventilator 4 many times, and momentum thereof is weakened. Since the lower space 23, that is, the path whose cross-sectional area is relatively large exists before entering the communication space 25 having a small cross-sectional area, the momentum of the fluid is weakened by an increase in cross-sectional area, and an amount of the water entering the communication space 25 is reduced. Since the momentum is weakened, most of the water entering the communication space 25 falls to the lower space 23 by gravity.

Since the momentum of the fluid entering from the communication space 25 into the upper space 24 that is the internal space of the inner hollow body 9 through the inner openings 10 is weakened because the cross-sectional area of the flow path in the communication space 25 is increased in the inner openings 10 and the upper space 24, and most of the water entering the upper space 24 falls to the inner bottom 19 by gravity.

Since the two inner openings 10 of the inner hollow body 9 are opposite to each other, water entering through any one of the inner openings 10 into the inner hollow body 9 flows out through the other inner opening 10. Alternatively, water reflected by the inner surface of the inner hollow body 9 is reduced in momentum, falls to the bottom, and flows out through the inner openings 10.

It is described the structure, owned by the waterproof ventilator 4, not to cause the water film due to surface tension to stay across the openings and the interior. Since a shape and size of each of the outer openings 7 are set to a shape and size not to be covered with the water film, even when a large amount of water jet blocks outer openings 7 for a while, no water film is formed after that. Since the interval W of the communication space 25 is set to an interval capable of preventing the water film from forming, no water is stayed in the communication space 25. It is rather difficult to consider that water enough to block entire of the inner openings 10 reaches the inner openings 10 at a time. However, even if such a situation occurs, since the shape and size of each of the inner openings 10 are set to a shape and a size not to be covered with the water film, the water does not remain as a water film covering the inner openings 10. There is a gap narrowed downward between the legs 21 of the bottom member 12 and the outer tube 13. The water may remain at this gap which is located outside the path along which the fluid flows. No problems with waterproofing are caused by the water remained in the gap. No space may be generated between the legs and the outer tube by changing the shape of the bottom member.

The shape and size of the opening or a shape and interval of the communication space are decided considering hydrophilicity of a material of the waterproof ventilator. In the case of a material having water repellency, even when the water repellency is reduced by aging degradation or the like, the shape and size of the opening or the communication space are decided not to be covered with the water film.

In a state where the waterproof ventilator 4 is mounted on a vent of an outdoor installation housing whose longitudinal and transverse dimensions are about 350 mm, a waterproof test prescribed by the degree of protection 6 (IPX6) of the JIS standard "Degrees of protection provided by enclosures for electrical equipment (JIS C 0920)" is carried out. As a result, it is confirmed that water do not enter an interior of the housing for outdoor installation, and the waterproof ventilator satisfies the IPX6 standard.

Further, it is confirmed that, even in a state where a negative pressure is generated in the housing, the waterproof ventilator satisfies the degree of protection 5 (IPX5) of the JIS standard. In the degree of protection 5 (IPX5), "there is no harmful effects caused by jets of water from all directions (a jet-proof type)" is needed.

A test method is described. Before the test, a temperature of the entire electronic device apparatus and air in the housing is raised. Upon starting a waterproof test prescribed by the degree of protection 5 (IPX5) of the JIS standard, the interior of the housing is cooled forcibly and immediately, a temperature change of about 40 degrees Celsius is generated during the waterproof test, and a negative pressure state is made in the interior of the electronic device apparatus during the waterproof test. By this evaluation test, a sufficient waterproof property of the electronic device apparatus is proved. Further, no water film stays across the openings and the interior of the waterproof ventilator, and ventilation between inside and outside of the electronic device apparatus can be performed.

The waterproof ventilator 4 is made up of two members of the double tubular member 11 and the bottom member 12, and can be assembled easily. Since the circular protrusion 18 to be fitted into the inner surface of the inner tube 19 is provided on the top of the bottom member 12, positional deviation within the xy plane of the inner bottom 19 is restricted when the bottom member 12 is assembled to the double tubular member 11. The bottom member 19 is held in the center of the inner tube 15 by the protrusion 18 shaped in a column with low height, and backlash in the fitting using the claws 21 and the through-holes 17 is restricted. Thereby, the flow path of this waterproof ventilator can be maintained in a desired size and shape without using an adhesive member or the like.

In the first embodiment, the external shape of the waterproof ventilator is the cylindrical shape, but it may be a rectangular tubular shape, a truncated cone shape, a truncated pyramid shape, a polyhedral shape, an ellipsoidal shape, or the like. The upper bottom of the outer hollow body and the upper bottom of the inner hollow body are in common with each other, but the upper portion of the inner hollow body may be projected from the outer hollow body. As long as at least a part of the inner hollow body is housed in the outer hollow body and the inner openings exist in the outer hollow body, the waterproof ventilator may be in any shape.

Among the members constituting the waterproof ventilator, the member having the upper opening to communicate with the vent of the housing may be formed integrally with the housing.

The number of outer openings is set to two, but it may be one or three or more. The number of inner openings may also be one or three or more. When the hollow body is adopted to have a single opening, the single opening has advantage in that size of the single opening can be increased easily to have a size not to be covered with the water film.

In the description, the outer openings are used as two openings having the same shapes and sizes. However, if the small outer opening is designed to have the shape and size not to be covered with the water film, any one or both of the shape and size of the outer openings may be different. With regard to the inner openings, under the condition satisfying that the small inner opening is designed to have the shape and size not to be covered with the water film, any one or both of the shape and size of the inner openings may be different.

The direction in which the two outer openings are opposite to each other and a direction in which the two inner openings are opposite to each other may not necessarily be orthogonal to each other. Any angle can be formed between the two directions, as long as the inner openings are disposed at positions at which the water entering through the outer openings does not hit directly. The two outer openings having the same shapes and sizes and the two inner openings having the same shapes and sizes are disposed such that the opposite directions thereof are orthogonal to each other. Thereby, any of the openings can have the same waterproof performance.

A standard other than JIS may be used as a waterproof standard. The present disclosure can be applied to a stricter or more moderate standard than the degree of protection 6 (IPX6) in the JIS standard. Even when the waterproof ventilator satisfies the waterproof performance decided uniquely regardless of the standard, the present disclosure can be applied.

Within the scope of the spirit of the present disclosure, modification and omission to the embodiment are possible.

REFERENCE SIGNS LIST

1: Electronic device
2: Housing
3: Vent
4: Waterproof ventilator
5: Boss
6: Housing-side hole
7: Outer opening
8: Outer hollow body
9: Inner hollow body
10: Inner opening
11: Double tubular member
12: Bottom member
13: Outer tube
14: Cutout
15: Inner tube
16: Cutout
17: Claw fitting hole
18: Protrusion
19: Inner bottom
20: Outer bottom
21: Leg (flow path restrictor)
22: Claw
23: Lower space
24: Upper space
25: Communication space
26: Path

The invention claimed is:
1. A waterproof ventilator comprising:
an outer hollow body having an internal space, a side with an outer opening adapted not to be covered with a water film at a lower portion thereof and a bottom having an inner surface and an outer surface;

an inner hollow body having an internal space, the inner hollow body being housed in the outer hollow body at least in a part thereof, and having: an outer surface disposed so as not to cause a water film to stay in a gap with an inner surface of the outer hollow body; an inner opening provided at a position not to be hit directly with water entering into the internal space of the outer hollow body through the outer opening and adapted not to be covered with a water film; an upper opening provided at an upper side than the inner opening and communicating with an exterior of the outer hollow body; and a bottom having an inner surface and an outer surface, wherein the inner surface of the outer hollow body includes the inner surface of the base of the outer hollow body, an outer surface of the outer hollow body includes the outer surface of the base of the outer hollow body, an inner surface of the inner hollow body includes the inner surface of the base of the inner hollow body, the outer surface of the inner hollow body includes the outer surface of the base of the inner hollow body, the internal space of the outer hollow body is formed by the inner surface of the outer hollow body and the outer surface of the inner hollow body, and the internal space of the inner hollow body is formed by the inner surface of the inner hollow body.

2. The waterproof ventilator according to claim 1, wherein the outer opening is provided at a position at which the water entering into the internal space of the outer hollow body is caused to run out of the outer hollow body through the outer opening by gravity.

3. The waterproof ventilator according to claim 2, wherein the inner opening is provided at a position at which the water entering into the internal space of the inner hollow body is caused to run out of the inner hollow body through the inner opening by gravity.

4. The waterproof ventilator according to claim 3, a flow path restrictor preventing a fluid from entering the inner opening from a lower side.

5. The waterproof ventilator according to claim 4, wherein the outer hollow body has two outer openings provided at positions opposite to each other; and wherein the inner hollow body has two inner openings provided at positions opposite to each other.

6. The waterproof ventilator according to claim 3, wherein the outer hollow body has two outer openings provided at positions opposite to each other; and wherein the inner hollow body has two inner openings provided at positions opposite to each other.

7. The waterproof ventilator according to claim 3, further comprising:
a bottom member having: an outer bottom being a lower bottom of the outer hollow body formed as a tube having an upper bottom and the lower bottom; an inner bottom being a lower bottom of the inner hollow body formed as a tube having an upper bottom and the lower bottom; and a link to connect the outer bottom and the inner bottom; and
a double tubular member having: an outer tube composing the outer hollow body with the outer bottom: and an inner tube composing the inner hollow body with the inner bottom.

8. The waterproof ventilator according to claim 1, wherein the inner opening is provided at a position at which the water entering into the internal space of the inner hollow body is caused to run out of the inner hollow body through the inner opening by gravity.

9. The waterproof ventilator according to claim 1, further comprising:
a flow path restrictor preventing a fluid from entering the inner opening from a lower side.

10. The waterproof ventilator according to claim 1, wherein the outer hollow body has two outer openings provided at positions opposite to each other.

11. The waterproof ventilator according to claim 1, wherein the inner hollow body has two inner openings provided at positions opposite to each other.

12. The waterproof ventilator according to claim 1, wherein the outer hollow body has two outer openings provided at positions opposite to each other; and wherein the inner hollow body has two inner openings provided at positions opposite to each other.

13. The waterproof ventilator according to claim 12, wherein a direction in which the two outer openings are opposite to each other and a direction in which the two inner openings are opposite to each other are orthogonal to each other.

14. The waterproof ventilator according to claim 13, further comprising:
a bottom member having: an outer bottom being a lower bottom of the outer hollow body formed as a tube having an upper bottom and the lower bottom; an inner bottom being a lower bottom of the inner hollow body formed as a tube having an upper bottom and the lower bottom; and a link to connect the outer bottom and the inner bottom; and
a double tubular member having: an outer tube composing the outer hollow body with the outer bottom: and an inner tube composing the inner hollow body with the inner bottom.

15. An electronic device apparatus comprising:
an electronic device;
a housing adapted to house the electronic device and having a vent in a bottom; and
the waterproof ventilator according to claim 8, the waterproof ventilator being mounted on the housing such that the vent and the upper opening communicate with each other.

16. The waterproof ventilator according to claim 12, further comprising:
a bottom member having: an outer bottom being a lower bottom of the outer hollow body formed as a tube having an upper bottom and the lower bottom; an inner bottom being a lower bottom of the inner hollow body formed as a tube having an upper bottom and the lower bottom; and a link to connect the outer bottom and the inner bottom; and
a double tubular member having: an outer tube composing the outer hollow body with the outer bottom: and an inner tube composing the inner hollow body with the inner bottom.

17. The waterproof ventilator according to claim 1, further comprising:
a bottom member having: an outer bottom being a lower bottom of the outer hollow body formed as a tube having an upper bottom and the lower bottom; an inner bottom being a lower bottom of the inner hollow body formed as a tube having an upper bottom and the lower bottom; and a link to connect the outer bottom and the inner bottom; and
a double tubular member having: an outer tube composing the outer hollow body with the outer bottom: and an inner tube composing the inner hollow body with the inner bottom.

18. The waterproof ventilator according to claim 17,
wherein the outer tube has a cutout provided at the lower bottom side to form the outer opening with the outer bottom; and
wherein the inner tube has a cutout provided at the lower bottom side to form the inner opening with the inner bottom.

19. An electronic device apparatus comprising:
an electronic device;
a housing adapted to house the electronic device and having a vent in a bottom; and
the waterproof ventilator according to claim 9, the waterproof ventilator being mounted on the housing such that the vent and the upper opening communicate with each other.

20. An electronic device apparatus comprising:
an electronic device;
a housing adapted to house the electronic device and having a vent in a bottom; and
the waterproof ventilator according to claim 1,
the waterproof ventilator being mounted on the housing such that the vent and the upper opening communicate with each other.

\* \* \* \* \*